United States Patent
Bastiaansen et al.

(10) Patent No.: US 8,927,178 B2
(45) Date of Patent: Jan. 6, 2015

(54) PROCESS FOR PREPARING A POLYMERIC RELIEF STRUCTURE

(75) Inventors: Cees C. Bastiaansen, Montfort (NL); Dirk Jan Broer, Geldrop (NL); Carlos C. Sanchez, Saragossa (ES)

(73) Assignee: Stichting Dutch Polymer Institute, Eindhoven (NL)

( * ) Notice: Subject to any disclaimer, the term of this patent is extended or adjusted under 35 U.S.C. 154(b) by 874 days.

(21) Appl. No.: 11/883,559

(22) PCT Filed: Feb. 9, 2006

(86) PCT No.: PCT/NL2006/000067
§ 371 (c)(1),
(2), (4) Date: Sep. 4, 2007

(87) PCT Pub. No.: WO2006/085757
PCT Pub. Date: Aug. 17, 2006

(65) Prior Publication Data
US 2008/0131626 A1   Jun. 5, 2008

(30) Foreign Application Priority Data

Feb. 9, 2005 (WO) ............... PCT/NL2005/000106

(51) Int. Cl.
G03F 7/36 (2006.01)
G03F 7/38 (2006.01)
G03F 7/00 (2006.01)
G03F 7/095 (2006.01)
G03F 7/038 (2006.01)

(52) U.S. Cl.
CPC ...... *G03F 7/001* (2013.01); *G03F 7/38* (2013.01); *G03F 7/36* (2013.01); *G03F 7/0955* (2013.01); *G03F 7/038* (2013.01)
USPC .................. 430/1; 430/2; 430/321

(58) Field of Classification Search
None
See application file for complete search history.

(56) References Cited

U.S. PATENT DOCUMENTS

| | | | | |
|---|---|---|---|---|
| 3,046,239 | A * | 7/1962 | Calvert | 524/269 |
| 3,658,526 | A * | 4/1972 | Haugh | 430/1 |
| 3,667,946 | A * | 6/1972 | Sturdevant | 430/1 |
| 3,993,485 | A * | 11/1976 | Chandross et al. | 385/141 |
| 4,517,280 | A * | 5/1985 | Okamoto et al. | 430/321 |
| 4,588,664 | A * | 5/1986 | Fielding et al. | 430/1 |
| 4,856,857 | A * | 8/1989 | Takeuchi et al. | 359/3 |
| 4,877,717 | A * | 10/1989 | Suzuki et al. | 430/321 |
| 4,943,471 | A * | 7/1990 | Uekita et al. | 428/220 |
| 4,970,129 | A * | 11/1990 | Ingwall et al. | 430/1 |
| 5,198,912 | A * | 3/1993 | Ingwall et al. | 359/3 |
| 5,252,414 | A * | 10/1993 | Yamashita et al. | 430/22 |
| 5,368,990 | A * | 11/1994 | Kawabata et al. | 430/281.1 |
| 5,418,113 | A * | 5/1995 | Yoshinaga et al. | 430/286.1 |
| 5,526,145 | A * | 6/1996 | Weber | 359/15 |
| 5,561,011 | A * | 10/1996 | Miyazaki et al. | 430/7 |
| 5,856,048 | A * | 1/1999 | Tahara et al. | 430/1 |
| 6,087,075 | A * | 7/2000 | Kler et al. | 430/321 |
| 6,730,442 | B1 * | 5/2004 | Sutherland et al. | 430/1 |
| 2001/0053004 | A1 * | 12/2001 | Nishikawa et al. | 359/15 |
| 2003/0124435 | A1 * | 7/2003 | Rich et al. | 430/1 |
| 2004/0067323 | A1 * | 4/2004 | Clabburn et al. | 428/1.26 |
| 2006/0141385 | A1 * | 6/2006 | Kaule | 430/270.1 |

FOREIGN PATENT DOCUMENTS

| | | |
|---|---|---|
| EP | 0 529 459 | 3/1993 |
| EP | 606940 * | 7/1994 |
| JP | 57-76017 | 5/1982 |
| JP | 59-009924 * | 1/1984 |
| JP | 61-041147 * | 2/1986 |
| JP | 05-035170 * | 2/1993 |
| JP | 05-188843 * | 7/1993 |
| JP | 05-297208 * | 11/1993 |
| JP | 10-219074 | 8/1998 |
| JP | 2000-199805 | 7/2000 |
| JP | 2001-133977 | 5/2001 |
| JP | 2004-070122 | 3/2004 |
| JP | 2007-527804 | 10/2007 |
| JP | 2007-530988 | 11/2007 |
| JP | 2011-505625 | 2/2011 |
| WO | WO 03/073165 | 9/2003 |
| WO | WO 2005/008321 A1 | 1/2005 |
| WO | 2005/057675 | 6/2005 |
| WO | 2005/081071 * | 9/2005 |

OTHER PUBLICATIONS

Material information sheet for SF(( (no date), 2 pages.*
International Search Report mailed Oct. 10, 2006 in PCT/NL2006/000067.
De Witz et al, "Photo-Embossing As a Tool for Creating Complex Surface Relief Structures," Philips Research Laboratories, NL.

* cited by examiner

*Primary Examiner* — Martin Angebranndt
(74) *Attorney, Agent, or Firm* — Nixon & Vanderhye P.C.

(57) ABSTRACT

The present invention relates to a process for the preparation of a polymeric relief structure by a) coating a substrate with a first coating composition comprising one or more radiation-sensitive ingredients, d) locally treating the coated substrate with electromagnetic radiation having a periodic or random radiation-intensity pattern, forming a latent image, e) polymerizing and/or crosslinking the resulting coated substrate to a first coating. This process is improved by applying a second coating composition on top of the first coating composition, said second coating composition comprising either an organic compound ($C_o$) of a monomeric nature and wherein $C_o$ is also polymerized during the process, or wherein said second coating comprises a dissolved polymer ($C_p$). As a result a polymeric relief structure is obtained, where a substrate is coated with a functional, stacked, bi-layer, in which each layer exhibits a specific, and from each other differing function.

21 Claims, No Drawings

PROCESS FOR PREPARING A POLYMERIC RELIEF STRUCTURE

This application is the US national phase of international application PCT/NL2006/000067 filed 9 Feb. 2006 which designated the U.S. and claims benefit of PCT/NL2005/000106, dated 9 Feb. 2005, the entire content of which is hereby incorporated by reference.

The present invention relates to a process for the preparation of a polymeric relief structure by a) coating a substrate with a first coating composition comprising one or more radiation-sensitive ingredients,
b) locally treating the coated substrate with electromagnetic radiation having a periodic or random radiation-intensity pattern, forming a latent image,
c) polymerizing and/or crosslinking the resulting coated substrate to a first coating.

Such a process, hereinafter also to be called "photo-embossing", is known from "Photo-embossing as a tool for complex surface relief structures", De Witz, Christiane; Broer, Dirk J., Abstracts of Papers, 226th ACS National Meeting, New York, N.Y., United States, Sep. 7-11, 2003.

Polymers in use in optical systems for data transport, storage and displays are nowadays of great interest. By structuring the surface of a polymer film or layer, light that passes these layers can be controlled. For instance if the surface structure contains small semi-sphere like elements, a lens array is obtained that may focus transmitted light. Such an element is for instance useful in a backlight of a liquid crystal display in order to focus light on the transparent area of the display. For these types of applications it is often necessary to control the shape of the surface profiles down to the micrometer region. Also regular patterns of surface structures may diffract light such that a single beam, upon transmission, is split up in multiple beams, that for instance can be used as beam splitter in telecommunication devices. Surface structures are also important to control reflection of light. This can successfully be applied to suppress specular reflection of a surface. This so-called anti-glare effect is for instance applied on the front screen of a television set, but can also be used for applications such as glazing, car finishes, etc. A polymer film, with well-defined surface profiles, may be provided with a conformal reflective film, such as evaporated aluminum or sputtered silver. Incident light falling on this mirror is, upon reflection, distributed in space in a very controlled way. This is for instance used to make internal diffusive reflectors for reflective liquid crystal displays. Another application of surface profiles is for creating anti-fouling structures known as the "Lotus effect". Thereto surface profiles with dimensions smaller than 1 micrometer are needed.

Electromagnetic-radiation induced polymerization, like UV photo-polymerization, is a method to prepare devices from e.g. a mixture of two (meth)acrylate monomers and a photo-initiator. The polymerization reaction is initiated only in those regions where the UV light can activate the photo-initiator. In addition, it is possible to vary the light intensity spatially and vary the polymerization speed accordingly. Differences in the monomer reactivity, size or length, cross-linking ability, and energetic interaction, result in gradients in the monomer chemical potentials. These chemical potentials form the driving force for monomer migration and for polymer swelling in the illuminated regions. The monomer diffusion coefficients determine the time-scale on which this migration takes place. Subsequently, uniform UV illumination with a higher intensity than during the patterned UV illumination is used to polymerize the entire film.

Patterned UV photo-polymerization of a mixture of two liquid monomers thus results in a polymer structure. This can be done holographically or lithographically. For holography, the interference pattern of two coherent light beams generates regions of high and low light intensity. For lithography, a photo-mask is used to produce these intensity differences. If for instance a striped mask is used, a grating is produced. If a mask with circular holes is used, a microlens structure is formed. Differences in the refractive index are caused by lateral variations of the monomer-unit concentrations in the polymer.

A better method to create a surface structure is to use a blend that basically consists of polymer(s), monomer(s) and initiator(s). The polymer can be a single polymeric material, but may also be a blend of more than one polymer. Similarly the monomer may be a single compound, but may also be consisting of several monomeric materials. The initiator preferably is a photoinitiator, but sometimes is a mixture of a photoinitiator and a thermal initiator. This mixture is generally dissolved in an organic solvent in order to enhance processing, e.g. formation of thin films by spin coating. The blending conditions as well as the properties of the polymer(s) and monomer(s) are chosen such that after evaporation of the solvent a solid film is formed. In general this allows that, upon patterned exposure with UV light, a latent image is formed. The latent image can be developed into a surface profile by heating, as a result of which polymerization and diffusion occur simultaneously, thus increasing the materials volume at the exposed area or visa versa, which results in a surface deformation.

An aim of the present invention is the preparation of a functional bi-layer on a substrate, having at least a relief structure on the interface of the two layers, and in which the two layers are substantially connected to each other.

As a result thereof, a polymeric relief structure is obtained, where a substrate is coated with a functional, stacked, bi-layer, in which each layer exhibits a specific, and from each other differing function. So can a first layer, closest to the substrate and carrying a relief structure, have anti-glare properties, whereas a second layer on top of said first layer have anti-reflective properties.

The application of an as-is polymeric layer on top of the first layer with a relief structure does not result in an acceptable bi-layer structure, as the second layer will not accurately enough follow the contours of the relief structure of the first layer.

Therefore, there is a need for a process in which a bi-layer structure is made, in which structure the two layers substantially integrally adhere to each other.

An additional weakness of a photo-embossing process is that the resulting relief structure has a rather low aspect ratio. The aspect ratio (AR) is hereinafter defined as the ratio between the relief height and the distance (or pitch) between neighboring reliefs. The edges of such a relief structure are not sharp or not accurately reproduced, as a result of which the optical function or other functionality that is aimed at is less optimal.

Moreover, often it is desired to introduce a second optical, electrical or electro-optical functionality to the structured film such as specific alignment characteristics for reactive or non-reactive mesogens, electro-luminescence, fluorescence and anti-reflex properties. In a specific embodiment of the present invention, this problem is also dealt with.

The present invention provides an improved process for preparing a polymeric relief structure, and is characterized in that a second coating composition is applied on top of the first coating composition, said second coating composition comprising either an organic compound ($C_o$) of a monomeric nature and wherein $C_o$ is also polymerized during the process, or wherein said second coating comprises a dissolved polymer ($C_p$), and wherein the polymer in the resulting second coating layer has a weight average molecular weight of at least 5 kDalton.

The present invention involves a process for preparing a polymeric relief structure in a material that is applied as a coating onto the photoembossing layer. The photoembossing layer provides the surface profile transmitted to the layer on top. The top layer provides another function that is combined with the function of the added surface relief. Examples of functions of the top player are:

- antireflex as caused by a surface nanostructure created by nanoparticles added to the second coating composition. The profile added by the photoembossing layer will enhance the antiglare properties of the film. In this way the unique combination of anti-reflex and anti-glare is established.
- Controlled optical retardation by a liquid crystalline monomer in the second coating composition. In this case the relief in the photoembossing film provides an alignment of the liquid crystal monomer that is subsequently frozen in by polymerization. The polymerized liquid crystal provides the optical retardation.
- The top layer can also be an alignment film for liquid crystals. In that case the relief of the photoembossed layer is transmitted to a relief in the alignment layer that may affect the orientation of a liquid crystal that is applied on it in a later stage. The alignment layer itself also has an effect on the liquid crystal alignment. The combination of both alignment effects allows exact tuning of the liquid crystal alignment. For instance two stable liquid crystal orientations can be achieved by choosing the alignment directions not to be parallel to each other. The alignment layer can be a rubbed polymer film (polyimide, polyvinylalcohol, nylon, etc.) or a film that has its alignment ability by photochemical processes (polyvinyl cinnamates, etc.).

From WO-A-2005/00832 a polymeric relief structure is known, comprising a polymeric first layer and a metal sheet as a second layer, said second layer being deposited from vaporized metal particles, or from a solvent comprising reflective metal flakes.

Various strategies can be followed to create a surface structure in the top film:

1. The photoembossed layer is applied and dried. Then the top layer is coated on top of this either from a polymer solution or as a monomer (solution), dried and used directly, or partially or completely cured. Subsequently, the photoembossed layer is exposed by e.g. UV light through a mask or by interference (holographic setup) and developed by a heating step. The photoembossed layer deforms and the top layer takes over this deformation.
2. The photoembossed layer is applied, dried and e.g. UV exposed through a mask or by interference. After this exposure the film is still flat to a large extent and is coated with the top layer that is dried and used directly, or partially or completely cured. Subsequently the surface is deformed by the heating step.
3. As in the previous two cases, but the heating step is performed in the situation that the top layer is still 'wet' (=not cured in case of the use of a monomer, or solvent containing in case of a polymer). Depending on the thickness of the applied layer, the free surface of the top layer does not take over the surface profile of the photoembossing layer but remains flat, or follows at least partially the profile.
4. The second layer can also be applied after the first coating is prepared (i.e. after step c) as described above). In this situation the photoembossed layer is already formed before the application of the second layer.

The first three strategies are preferred.

In a specific embodiment, compound $C_o$ of a monomeric nature, or compound $C_p$ reduces the interfacial tension of the coated substrate of step b).

As a result, relief structures with an enhanced relief aspect ratio (the improvement typically showing an increase of a factor 2), as well as much sharper edged relief, are obtained.

The monomer compound $C_o$, when used to reduce the interfacial surface tension, can be applied in at least two distinct ways. The first way is in a process, wherein $C_o$ is applied to the coated substrate resulting from step b) of the present process, after which step c) is executed. The second way is in a process, in which the $C_o$ is already present in the coating used in step b) of the present process. As a result hereof, $C_o$ is present in step b) as well as in step c).

The coating composition used in step a) of the present process comprises one or more radiation sensitive ingredients, which in general are C═C unsaturated monomers, polymerizable via electromagnetic radiation. These ingredients can be used as such, but also in the form of a solution.

This first coating composition may be applied onto the substrate by any process known in the art of (wet) coating deposition. Examples of suitable processes are spin coating, dip coating, spray coating, flow coating, meniscus coating, doctor's blading, capillary coating, and roll coating.

Typically, the radiation sensitive ingredient(s) are mixed, preferably with at least one solvent and, optionally, crosslinking initiator, to prepare a mixture that is suitable for application to the substrate using the chosen method of application.

In principle, a wide variety of solvents may be used. However, the combination of the solvents and all other materials present in the mixture should preferentially form stable suspensions or solutions.

Preferably, the solvent used is evaporated after applying the first coating composition onto the substrate. In the process according to the invention, optionally the first coating composition may, after application to the substrate, be heated or treated in vacuum to aid evaporation of the solvent. As a result, the first coating is a solid film.

Examples of solvents that are suitable are 1,4-dioxane, acetone, acetonitrile, chloroform, chlorophenol, cyclohexane, cyclohexanone, cyclopentanone, dichloromethane, diethyl acetate, diethyl ketone, dimethyl carbonate, dimethylformamide, dimethylsulphoxide, ethanol, ethyl acetate, m-cresol, mono- and di-alkyl substituted glycols, N,N-dimethylacetamide, p-chlorophenol, 1,2-propanediol, 1-pentanol, 1-propanol, 2-hexanone, 2-methoxyethanol, 2-methyl-2-propanol, 2-octanone, 2-propanol, 3-pentanone, 4-methyl-2-pentanone, hexafluoroisopropanol, methanol, methyl acetate, butyl acetate, methyl acetoacetate, methyl ethyl ketone, methyl propyl ketone, n-methylpyrrolidone-2, n-pentyl acetate, phenol, tetrafluoro-n-propanol, tetrafluoroisopropanol, tetrahydrofuran, toluene, xylene and water. Alcohol, ketone and ester based solvents may also be used, although the solubility of acrylates may become an issue with high molecular weight alcohols. Halogenated solvents (such as dichloromethane and chloroform) and hydrocarbons (such as hexanes and cyclohexanes) are also suitable.

The first coating composition comprises one or more radiation-sensitive ingredients, being a compound that upon exposure to actinic radiation generates a reactive species, i.e. free-radicals or cationic species that initiates the polymerization. Examples of monomers suitable for use as polymerizing ingredient and having at least two crosslinkable groups per molecule include monomers containing (meth)acryloyl groups (such as trimethylolpropane tri(meth)acrylate, pentaerythritol (meth)acrylate), ethylene glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, trimethylolpropanetrioxyethyl (meth)acrylate, tris(2-hydroxyethyl)isocyanurate tri(meth) acrylate, tris(2-hydroxyethyl)isocyanurate di(meth)acrylate, pentaerythritol tri(meth)acrylate, pentaerythritol tetra(meth) acrylate, dipentaerythritol monohydroxy pentacrylate, dipentaerythritol hexacrylate, tricyclodecane diyl dimethyl di(meth)acrylate and alkoxylated versions, preferably ethoxylated and/or propoxylated, of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, adduct of hydroxyethyl acrylate, isophorone diisocyanate and hydroxyethyl acrylate (H1H), adduct of hydroxyethyl acrylate, toluene diisocyanate and hydroxyethyl acrylate (HTH), and amide ester acrylate.

Examples of suitable monomers having only one crosslinking group per molecule include monomers containing a vinyl group, such as N-vinyl pyrrolidone, N-vinyl caprolactam, vinyl imidazole, vinyl pyridine; isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth) acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth) acrylate, octyl (meth)acrylate, isooctyl (meth)acrylate, 2-ethylhexyl (meth)acrylate, nonyl (meth)acrylate, decyl (meth) acrylate, isodecyl (meth)acrylate, tridecyl (meth)acrylate, undecyl (meth)acrylate, lauryl (meth)acrylate, stearyl (meth) acrylate, isostearyl (meth)acrylate, tetrahydrofurfuryl (meth) acrylate, butoxyethyl (meth)acrylate, ethoxydiethylene glycol (meth)acrylate, benzyl (meth)acrylate, phenoxyethyl (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, isobutoxymethyl (meth)acrylamide, N,N-dimethyl (meth) acrylamide, t-octyl (meth)acrylamide, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate, N,N-diethyl (meth)acrylamide, N,N-dimethylaminopropyl (meth)acrylamide, hydroxybutyl vinyl ether, lauryl vinyl ether, cetyl vinyl ether, 2-ethylhexyl vinyl ether; and compounds represented by the following formula (I)

$$CH_2=C(R^6)-COO(R^7O)_m-R^8 \quad (I)$$

wherein $R^6$ is a hydrogen atom or a methyl group; $R^7$ is an alkylene group containing 2 to 8, preferably 2 to 5 carbon atoms; and m is an integer from 0 to 12, and preferably from 1 to 8; $R^8$ is a hydrogen atom or an alkyl group containing 1 to 12, preferably 1 to 9, carbon atoms; or, $R^8$ is a tetrahydrofuran group—comprising alkyl group with 4-20 carbon atoms, optionally substituted with alkyl groups with 1-2 carbon atoms; or $R^8$ is a dioxane group-comprising alkyl group with 4-20 carbon atoms, optionally substituted with methyl groups; or $R^8$ is an aromatic group, optionally substituted with $C_1$-$C_{12}$ alkyl group, preferably a $C_8$-$C_9$ alkyl group, and alkoxylated aliphatic monofunctional monomers, such as ethoxylated isodecyl (meth)acrylate, ethoxylated lauryl (meth)acrylate, and the like.

Oligomers suitable for use as a radiation sensitive ingredient in the coating composition of step a) are for example aromatic or aliphatic urethane acrylates or oligomers based on phenolic resins (ex. bisphenol epoxy diacrylates), and any of the above oligomers chain extended with ethoxylates. Urethane oligomers may for example be based on a polyol backbone, for example polyether polyols, polyester polyols, polycarbonate polyols, polycaprolactone polyols, acrylic polyols, and the like. These polyols may be used either individually or in combinations of two or more. There are no specific limitations to the manner of polymerization of the structural units in these polyols. Any of random polymerization, block polymerization, or graft polymerization is acceptable. Examples of suitable polyols, polyisocyanates and hydroxyl group-containing (meth)acrylates for the formation of urethane oligomers are disclosed in WO 00/18696, which is incorporated herein by reference.

Combinations of compounds that together may result in the formation of a crosslinked phase and thus in combination are suitable to be used are for example carboxylic acids and/or carboxylic anhydrides combined with epoxies, acids combined with hydroxy compounds, especially 2-hydroxyalkylamides, amines combined with isocyanates, for example blocked isocyanate, uretdion or carbodiimide, epoxies combined with amines or with dicyandiamides, hydrazinamides combined with isocyanates, hydroxy compounds combined with isocyanates, for example blocked isocyanate, uretdion or carbodiimide, hydroxy compounds combined with anhydrides, hydroxy compounds combined with (etherified) methylolamide ("amino-resins"), thiols combined with isocyanates, thiols combined with acrylates or other vinylic species (optionally radical initiated), acetoacetate combined with acrylates, and when cationic crosslinking is used epoxy compounds with epoxy or hydroxy compounds.

Further possible compounds that may be used as a radiation sensitive ingredient are moisture curable isocyanates, moisture curable mixtures of alkoxy/acyloxy-silanes, alkoxy titanates, alkoxy zirconates, or urea-, urea/melamine-, melamine-formaldehyde or phenol-formaldehyde (resol, novolac types), or radical curable (peroxide- or photo-initiated) ethylenically unsaturated mono- and polyfunctional monomers and polymers, e.g. acrylates, methacrylates, maleate/vinyl ether), or radical curable (peroxide- or photo-initiated) unsaturated e.g. maleic or fumaric, polyesters in styrene and/or in methacrylates. Preferably the ingredient(s) in the radiation-sensitive first coating composition is/are selected from the group comprising (meth-) acrylates, epoxies, oxetanes, vinyl ethers, styrenes, and thiol-enes.

Preferably, the applied coating composition used in step a) also comprises a polymer. Preferably, this polymer has a weight-averaged molecular weight (Mw) of at least 20,000 g/mol. Such a polymer, when used in the coating composition of step a), preferably has a glass transition temperature of at least 300 K. Preferably, the polymer in the coating composition used in step a) is dissolved in the monomer(s), present in the radiation sensitive coating composition of step a), or in the solvent used in the coating composition of step a) of the process of the present invention.

A wide variety of inorganic or organic substrates may be used as a substrate in the process according to the invention. Suitable substrates are for example flat or curved, rigid or flexible polymeric substrates, including films of for example polycarbonate, polyester, polyvinyl acetate, polyvinyl pyrollidone, polyvinyl chloride, polyimide, polyethylene naphthalate, polytetrafluoro-ethylene, nylon, polynorbornene; or amorphous solids, for example glass or crystalline materials, such as for example silicon or gallium arsenide. Metallic substrates may also be used. Preferred substrates for use in display applications are for example glass, polynorbornene, polyethersulfone, polyethyleneterephtalate, polyimide, cellulose triacetate, polycarbonate and polyethylenenaphthalate.

An initiator may be present in the first coating composition to initiate the crosslinking reaction. The amount of initiator may vary between wide ranges. A suitable amount of initiator is for example between above 0 and 5 wt % with respect to total weight of the compounds that take part in the crosslinking reaction.

When UV-crosslinking is used to initiate crosslinking, the mixture preferably comprises a UV-photo-initiator. A photo-initiator is capable of initiating a crosslinking reaction upon absorption of light; thus, UV-photo-initiators absorb light in the Ultra-Violet region of the spectrum. Any known UV-photo-initiator may be used in the process according to the invention. Preferably the polymerization initiator comprises a mixture of a photo initiator and a thermal initiator.

In step b) of the process of the present invention the coated substrate resulting form process step a) is locally treated with electromagnetic radiation having a periodic or latent radiation intensity pattering as a result of which a latent image is formed. In one preferred embodiment, this treatment is performed using UV-light in combination with a mask. In another preferred embodiment, this treatment is performed by the use of light interference/holography. Still another embodiment is by the use of electron beam lithography.

Any cross-linking method that may cause the first coating composition to polymerize and/or crosslink so that a final first coating is formed, is suitable to be used in the process according to the invention. Suitable ways to initiate crosslinking are for example electron beam radiation, electromagnetic radiation (UV, Visible and Near IR), thermally, and by adding moisture, in case moisture-curable compounds are used. In a preferred embodiment crosslinking is achieved by UV-radiation. The UV-crosslinking may take place through a free radical mechanism or by a cationic mechanism, or a combination thereof. In another preferred embodiment the crosslinking is achieved thermally.

In the present invention a second coating composition is applied on top of the first composition, wherein said second coating composition comprises either an organic compound $(C_o)$ of a monomeric nature, or said second coating composition comprises a dissolved polymer $(C_p)$. In the case of the use of a dissolved polymer, it is preferable to apply the polymer, having a weight average molecular weight of at least 5 kDalton (determined by GPC), by a coating process using a volatile solvent. In case of the use of $C_o$, it may also be in the form of a monomer/polymer mixture/solution, or as a monomer dissolved in a volatile solvent, said solvent being evaporated after coating. In the case that an organic compound of a monomeric nature is used, said compound is polymerized later on in the process to a weight average molecular weight of at least 5 kDalton (determined by GPC). In both cases ($C_o$ and $C_p$) it is preferred that a bi-layer structure is formed after coating, i.e. mutual dissolution of the components of the first and second coating is preferably avoided as much as possible.

In a specific embodiment of the present invention, the organic compound $(C_o)$ of a monomeric nature reduces the interfacial tension between the photo-polymer of step and its surroundings, and $C_o$ is polymerized after step c). For the term "Interfacial tension", reference is given to the publication "Polymer Surfaces" from F. Garbossi et. al, Wiley 1994, pages 183-184, where a description is given how to determine the interfacial tension of a solid with air by using a Zisman-plot. In order to achieve and evaluate the benefits of the present invention, it is advisable to first determine the interfacial tension of a coated substrate (with air), obtained with all the ingredients except $C_o$, and compare the so-obtained value with the interfacial tension of the coated substrate obtained with all the ingredients (thus including $C_o$) (See Fryer et al. Macromolecules, 2001, 34, page 5627-5634). Preferably, the $C_o$ reduces the interfacial tension with at least 10 mJ/m$^2$.

$C_o$ can be of the same nature as the monomer(s) applicable in the coating composition of step a), as described before. Preference is given to $C_o$ being selected from the group comprising (meth-) acrylates, epoxies, oxetanes, vinyl esters, styrenes, and thiol-enes. For specific applications it is preferred that a liquid crystalline, polymerizable monomer is used. Another preference is that $C_o$ or $C_p$ also comprise an inorganic filler (as such known in the art, like talcum). Another preference is for $C_o$ being selected from the group of polymerizable monomers, which after polymerization produce an inorganic material. In order to be polymerized in step c), $C_o$ preferably also comprises one or more polymerization-initiators; preferred in the form of a thermal initiator or a mixture of a photo-initiator and a thermal initiator. Said polymerization of $C_o$ preferably is performed with heat, UV-light, e-beam irradiation, X-ray irradiation, ion beam irradiation, visible light irradiation, or IR-light.

$C_o$ may also comprise a polymer, next to the organic compound of monomeric nature. Preferably said polymer is selected from the group comprising: a) thermoplastic semi-crystalline or amorphous polymers, b) thermoplastic elastomers (TPE, TPV), and c) chemically crosslinkable rubbers.

The use of $C_o$ or $C_p$ is preferably in an amount of 0.01-5 times the amount of the first coating; more preferred, said amount is in the range of 0.05-2.5.

The conditions under which the process steps a)-c) have to be performed, are as such known in the art of radiation polymerization. As temperatures for said process steps preferably a temperature of between 175 and 375 K is used for step b), and preferably a temperature of between 300 and 575 K is used for step c). The conditions are of course selected such that they advocate both the polymerization of the ingredients in the first coating composition as well as, when relevant, the polymerization of $C_o$.

The second coating composition can also comprise a dissolved polymer $(C_p)$, application of which results in a second coating layer. The selection of $C_p$ is such that it adds a second functionality to the polymeric relief structure. In the process of the present invention, $C_p$ is applied in the form of a solution of the polymer in a suitable solvent. The solvent has to be selected as such that it dissolves the polymer ($C_p$) to be used in the second coating composition, but on the other hand has (hardly) any influence on the ingredients of the first coating composition or on the polymer formed there from. $C_p$ can be of the same nature as the polymer described above when used in conjunction with the use of $C_o$ in the second coating composition. After the application of the second coating composition as a solution of the polymer $C_p$, the solvent is removed, preferably by evaporation, by as such known techniques.

Preferably, the conditions under which the process a)-c) are performed ensure that the generation of the relief structure is not/hardly influenced by the second layer. In practice, a preference is given to systems in which the first (photo-embossed) coating and the second layer are mutually insoluble and/or hardly interact at the interface. Typically, a very hydrophobic nature is selected for $C_o$ or $C_p$ if the first layer is hydrophilic, either before or after polymerization. The same applies visa versa.

The polymeric relief structures of the present invention can have an improved aspect ratio as well as an improved sharpness, especially at the interface between the first and the second layer; this in case when $C_o$ reduces the interfacial tension of the first coating. The aspect ratio (AR, being the ratio between the relief height, and the distance between neighbouring reliefs, both in μm) of the reliefs of the invention is then in general at least 0.075, and more preferably at least 0.12; even more preferably, the AR is at least 0.2. The sharpness of the relief structure can be quantified by the maximum absolute value of the curvature k. The procedure to derive the curvature k from AFM measurements is as follows: (i) the shape of the relief structure is fitted with, for instance, a Boltzmann fit, (ii) the first and second derivative of the fit are calculated, (iii) the curvature k is calculated with $$k = \frac{f''(x)}{(1+f'(x)^2)^{3/2}}$$

The absolute maximum value for the curvature ($|k_{max}|$) of the relief structures according to the invention is at least 0.35 and more preferably at least 0.45 and even more preferably 0.65 $\mu m^{-1}$ most preferred at least 0.7 $\mu m^{-1}$. Both parameters (aspect ratio and sharpness) are to be determined via atomic force microscopy (AFM).

The thickness of the second layer can be controlled, for instance, by the deposition conditions. Consequently, the end result might be a film with a relief structure at the air-interface which is (almost) identical to the relief structure at the interface between the first and second layer. Alternatively, the second layer can be so thick that it forms a smooth surface, despite the presence of a relief structure at the interface between the first and second layer. Of course all kinds of intermediate structures can also be generated; it's usefulness is determined by the desired functionality/application. Of course, the enhancement of the aspect ratio and sharpness of the surface structure is reduced if a rather thick monomer or polymer layer is used in the second coating.

The polymeric relief structures of the present invention are applicable in optical components, preferably in light management applications. Preferred embodiments thereof are refractive-, diffractive- or holographic-optical elements or antireflective and/or antiglare layers. Another preference of the use of the polymeric relief structure according to the present invention is the use as a structured electrode, a fluorescent layer, an electro-luminescent layer, a structured metallic, or a ceramic layer. Another, and preferred embodiment is the use of the polymeric relief structure as a master for replication purposes in organic or inorganic matter. Still another preference is the use of the polymeric relief structure of the present invention as an orientation layer for a second species. Preferably, said second species is a monomer, a polymer, a liquid crystalline monomer, a liquid crystalline polymer, a electroluminescent monomer, a electro-luminescent polymer, a polymeric alignment layer, a self assembled monolayer and/or mixtures thereof.

The present invention will be elucidated with the following Examples and comparative experiment. They are not aimed to restrict the invention.

COMPARATIVE EXPERIMENT A

A glass substrate was coated by spincoating (1000 rpm, 60 seconds) with a photopolymer mixture consisting of a polymeric binder (47.5% w/w) (polybenzylmethacrylate, Aldrich), a multifunctional monomer (47.5% w/w) (dipenthaerythritol penta/hexa-acrylate, Aldrich) and photoinitiator (5% w/w) (Irgacure 819, Ciba Specialty Chemicals). The photopolymer mixture was dissolved in a solvent mixture containing 50% w/w propyleneglycolmethyletheracetate (Aldrich) and 50% w/w ethoxypropylacetate (Avocado Research Chemicals). The ratio photopolymer mixture to solvent mixture was 1:2. After spincoating, residual solvent was removed by heating to 80° C. for 10 minutes, after which the sample was cooled to room temperature. A substrate coated with a dry photopolymer film was obtained with a thickness of 3 micron. This sample was illuminated using a mask and collimated UV light source (USHIO, UXM-502 MD, 500 W HG) at an intensity of approximately 13 mW (UV-A) for 20 seconds. The mask was placed in direct contact with the photopolymer and it consisted of line patterns with pitches of 5, 8, 10, 15, 20, 30 and 40 micron. The ratio of transparent and non-transparent regions of the mask was 1:1. After illumination, the sample was heated to a temperature of 80° C. for 10 minutes. The sample was exposed to a flood exposure for 5 minutes at 80° C. The relief structures were measured with an optical profilometer (Fogale Zoomsurf 3D). The results are listed in Table 1, column 2.

EXAMPLE 1

A glass substrate was coated by spincoating (1000 rpm, 60 seconds) with a photopolymer mixture consisting of a polymeric binder (47.5% w/w) (polybenzylmethacrylate, Aldrich), a multifunctional monomer (47.5% w/w) (dipenthaerythritol penta/hexa-acrylate, Aldrich) and photoinitiator (5% w/w) (Irgacure 819, Ciba Specialty Chemicals). The photopolymer mixture was dissolved in a solvent mixture containing 50% propyleneglycolmethyletheracetate (Aldrich) and 50% ethoxypropylacetate (Avocado Research Chemicals). The ratio photopolymer mixture to solvent mixture was 1:2. After spincoating, residual solvent was removed by heating to 80° C. for 10 minutes, after which the sample was cooled to room temperature. A substrate coated with a dry photopolymer film was obtained with a thickness of 3 micron. This sample was illuminated using a mask and collimated UV light source (UXM-502 MD USHIO 500 W Mercury) at an intensity of approximately 13 mW (UV-A) for 20 seconds. The mask was placed in direct contact with the photopolymer and it consisted of line patterns with pitches of 5, 8, 10, 15, 20, 30 and 40 micron. The ratio of transparent and non-transparent regions of the mask was 1:1. After exposure, a second layer was deposited. A polymer solution consisting of a triblockcopolymer (1% w/w) (SEBS 1652, Kraton Polymers) and n-heptane (Aldrich) was deposited by spincoating, resulting in a layer thickness of the second layer of approximately 100 nm. After illumination the sample was heated to a temperature of 80° C. for 10 minutes. The sample was exposed to a flood exposure for 5 minutes at 80° C. The relief structures were measured with an optical profilometer (Fogale Zoomsurf 3D) and the results are listen in Table 1, column 3. The second polymer layer was removed by dissolution in n-heptane and surface relief structures were remeasured. (see Table 1, column 4)

TABLE 1

| Pitches [μm] | Height of the reference sample [nm] | Height of the bi-layer [nm] | Height after dissolution of the 2$^{nd}$ layer in n-heptane [nm] |
|---|---|---|---|
| 5 | 47 | 50 | 43 |
| 8 | 151 | 142 | 130 |
| 10 | 207 | 201 | 175 |
| 15 | 209 | 225 | 257 |
| 20 | 312 | 314 | 312 |
| 30 | 396 | 324 | 310 |
| 40 | — | — | 300 |

| Pitches [μm] | Aspect Ratio of the reference sample [-] | Aspect Ratio of the bi-layer [-] | Aspect Ratio after dissolution of the 2$^{nd}$ layer in n-heptane [-] |
|---|---|---|---|
| 5 | 0.0188 | 0.0200 | 0.0172 |
| 8 | 0.0378 | 0.0355 | 0.0325 |
| 10 | 0.0414 | 0.0402 | 0.0350 |
| 15 | 0.0279 | 0.0300 | 0.0343 |
| 20 | 0.0312 | 0.0314 | 0.0312 |
| 30 | 0.0264 | 0.0216 | 0.0207 |
| 40 | — | — | 0.0150 |

The results show that a relief structure can be generated in a polymeric bi-layer and that the height of the relief structures at the interface of the first and the second layer and at the air interface is preserved.

EXAMPLE 2

Samples were prepared and measured according to Example 1. New reference samples were produced, and the result of these samples are listed in Table 2, column 2. The second polymer layer was spincoated from solution containing different concentrations of SEBS (2, 4, 8% w/w), which resulted in layer thicknesses of the second layer of respectively 150, 400, and 2000 nm. The results are listed in Table 2, columns 3, 4 and 5.

TABLE 2

| Pitches [μm] | Height Reference sample [nm] | 150 nm thick SEBS Height [nm] | 400 nm thick SEBS Height [nm] | 2000 nm thick SEBS Height [nm] |
|---|---|---|---|---|
| 5 | 175 | 90 | 50 | 20 |
| 8 | 260 | 270 | 210 | 120 |
| 10 | 310 | 350 | 300 | 210 |
| 15 | 405 | 440 | 400 | 400 |
| 20 | 440 | 510 | 520 | 600 |
| 30 | 630 | 640 | 600 | 550 |
| 40 | 590 | 700 | 605 | 600 |

| Pitches [μm] | Aspect Ratio of the Reference sample [-] | 150 nm thick SEBS Aspect Ratio [-] | 400 nm thick SEBS Aspect Ratio [-] | 2000 nm thick SEBS Aspect Ratio [-] |
|---|---|---|---|---|
| 5 | 0.0700 | 0.0360 | 0.0200 | 0.0080 |
| 8 | 0.0650 | 0.0675 | 0.0525 | 0.0300 |
| 10 | 0.0620 | 0.0700 | 0.0600 | 0.0420 |
| 15 | 0.0540 | 0.0587 | 0.0533 | 0.0533 |
| 20 | 0.0440 | 0.0510 | 0.0520 | 0.0600 |
| 30 | 0.0420 | 0.0423 | 0.0400 | 0.0367 |
| 40 | 0.0295 | 0.0350 | 0.0303 | 0.0300 |

The results illustrate that the height of the relief structures in the second layer at the air interface decreases with increasing layer thickness of the second layer. The relief structure at the interface of the first and second layer is preserved and the relief structure at the air interface is almost completely or partly preserved dependant on, for instance, the pitch and/or the layer thickness of the second layer.

EXAMPLE 3

Samples were prepared according to Example 1; the second layer consisted of a film of polyvinylalcohol or a PDMS-PS blockcopolymer. In the case of polyvinylalcohol, water was used as a solvent during the spincoating of the second layer. In the case of PDMS-PS, n-heptane was used as a solvent during the spincoating of the second layer. In both cases a relief structure was obtained at the interface of the first and second polymer and/or at the air interface dependant on the experimental conditions during spincoating and/or pitch of the structures etc.

EXAMPLE 4

A glass substrate was coated by spincoating (1000 rpm, 60 seconds) with a photopolymer mixture consisting of a polymeric binder (47.5% w/w) (polybenzylmethacrylate, Aldrich), a multifunctional monomer (47.5% w/w) (dipenthaerythritol penta/hexa-acrylate, Aldrich) and photoinitiator (5% w/w) (Irgacure 819, Ciba Specialty Chemicals). The photopolymer mixture was dissolved in a solvent mixture containing 50% propyleneglycolmethyletheracetate (Aldrich) and 50% ethoxypropylacetate (Avocado Research Chemicals). The ratio photopolymer mixture to solvent mixture was 1:2. After spincoating, residual solvent was removed by heating to 80° C. for 10 minutes, after which the sample was cooled to room temperature. A substrate coated with a dry photopolymer film was obtained with a thickness of 3 micron. This sample was illuminated using a mask and collimated UV light source (UXM-502 MD USHIO 500 W Mercury) at an intensity of approximately 13 mW (UV-A) for 20 seconds. The mask was placed in direct contact with the photopolymer and it consisted of line patterns with pitches of 5, 8, 10, 15, 20, 30 and 40 micron. The ratio of transparent and non-transparent regions of the mask was 1:1. After exposure, a second layer was deposited. A monomer solution consisting of a monomer (1% w/w) (octadecylacrylate, Aldrich)), an inhibitor (1% w/w) (hydroquinone) and n-heptane (Aldrich) was used, which was dropcasted. After illumination, the sample was heated to a temperature of 80° C. for 10 minutes in an air atmosphere, and the sample was exposed to a flood exposure for 5 minutes at 80° C. The monomer layer was removed by dissolution in n-heptane and surface relief structures were measured with an optical profilometer (Fogale Zoomsurf 3D). The results are shown in Table 3, column 3. Reference samples were also produced without octadecylacrylate and the results are shown in Table 3, column 2.

TABLE 3

| Pitches [μm] | Height Reference sample [nm] | Height after dissolution in n-heptane [nm] |
|---|---|---|
| 5 | 5 | 40 |
| 8 | 80 | 340 |
| 10 | 156 | 414 |
| 15 | 314 | 570 |
| 20 | 450 | 700 |
| 30 | 550 | 765 |
| 40 | 550 | 800 |

| Pitches [μm] | Aspect Ratio Reference sample [-] | Aspect Ratio after dissolution in n-heptane [-] |
|---|---|---|
| 5 | 0.0020 | 0.0160 |
| 8 | 0.0200 | 0.0850 |
| 10 | 0.0312 | 0.0828 |
| 15 | 0.0419 | 0.0760 |
| 20 | 0.0450 | 0.0700 |
| 30 | 0.0367 | 0.0510 |
| 40 | 0.0275 | 0.0400 |

The results show that a relief structure can be generated in the photopolymer in the presence of a monomer, and that the relief height increases due to the presence of the monomer.

EXAMPLE 5

A glass substrate was coated by spincoating (1000 rpm, 60 seconds) with a photopolymer mixture consisting of a polymeric binder (47.5% w/w) (polybenzylmethacrylate, Aldrich), a multifunctional monomer (47.5% w/w) (dipenthaerythritol penta/hexa-acrylate, Aldrich) and photo-initiator (5% w/w) (Irgacure 819, Ciba Specialty Chemicals). The photopolymer mixture was dissolved in a solvent mixture containing 50% propyleneglycolmethyletheracetate (Aldrich) and 50% ethoxypropylacetate (Avocado Research Chemicals). The ratio photopolymer mixture to solvent mixture was 1:2. After spincoating, residual solvent was removed by heating to 80° C. for 10 minutes, after which the sample was cooled to room temperature. A substrate coated with a dry photopolymer film was obtained with a thickness of 3 micron. This sample was illuminated using a mask and collimated UV light source (UXM-502 MD USHIO 500 W Mercury) at an intensity of approximately 13 mW (UV-A) for 20 seconds. The mask was placed in direct contact with the photopolymer and it consisted of line patterns with pitches of 5, 8, 10, 15 and 20 micron. The ratio of transparent and non-transparent regions of the mask was 1:1. After exposure, a second layer was deposited on the exposed photopolymer by spincoating. A monomer solution consisting of a monomer (octadecylacrylate (ODA), Aldrich), a photo-initiator (2% w/w) (Irgacure 819, Ciba Specialty Chemicals) and n-heptane (Aldrich) was used, which was spincoated (1000 rpm, 60 seconds). The monomer concentration was varied from 0, 1, 2.5, 5, 10 and 20% w/w resulting in layer thicknesses of respectively 0, 100, 215, 280, 440 and 1200 nm. After illumination the sample was heated to a temperature of 80° C. for 10 minutes in an air atmosphere. Subsequently the sample was exposed to a flood exposure for 5 minutes at 80° C. under a nitrogen atmosphere. During the flood exposure all the residual monomer was polymerized. The resulting structures were measured with an optical profilometer (Fogale Zoomsurf 3D). The results are given in Table 4, column 2-7. Reference samples were also produced without octadecylacrylate and the results are shown in Table 4, column 1.

TABLE 4

| Pitches [μm] | Height Reference Sample [nm] | 100 nm thick ODA Height [nm] | 215 nm thick ODA Height [nm] | 280 nm thick ODA Height [nm] | 440 nm thick ODA Height [nm] | 1200 nm thick ODA Height [nm] |
|---|---|---|---|---|---|---|
| 5 | 12 | 60 | 155 | 35 | 129 | 60 |
| 8 | 165 | 375 | 300 | 203 | 379 | 243 |
| 10 | 557 | 535 | 550 | 461 | 662 | 450 |
| 15 | 810 | 875 | 862 | 879 | 999 | 810 |
| 20 | 955 | 1036 | 1037 | 1177 | 1206 | 1090 |

| Pitches [μm] | Aspect Ratio Reference Sample [-] | 100 nm thick ODA Aspect Ratio [-] | 215 nm thick ODA Aspect Ratio [-] | 280 nm thick ODA Aspect Ratio [-] | 440 nm thick ODA Aspect Ratio [-] | 1200 nm thick ODA Aspect Ratio [-] |
|---|---|---|---|---|---|---|
| 5 | 0.0048 | 0.0240 | 0.0620 | 0.0140 | 0.0516 | 0.0240 |
| 8 | 0.0413 | 0.0938 | 0.0750 | 0.0508 | 0.0948 | 0.0608 |
| 10 | 0.1114 | 0.1070 | 0.1100 | 0.0922 | 0.1324 | 0.0900 |
| 15 | 0.1080 | 0.1167 | 0.1149 | 0.1172 | 0.1332 | 0.1080 |
| 20 | 0.0955 | 0.1036 | 0.1037 | 0.1177 | 0.1206 | 0.1090 |

The results illustrate that the height of the relief structures in the second layer at the air interface is maintained in the investigated range of the thicknesses of the second layer.

EXAMPLE 6

Samples were prepared according to Example 5; the second layer consisted of a film of a mixture of RM257 (Merck) and E7 (Merck) in a 1:1 ratio, with 5% w/w Irgacure 819 (Ciba Specialty Chemicals). The second layer was spincoated onto the photopolymer (first layer) without using any additional volatile solvent. In these Examples relief structures were obtained at the polymer air interface with a typical height of approximately 800 nm at a pitch of 15 micron.

The invention claimed is:
1. A photoembossing process for the preparation of a polymeric relief structure comprised of a bi-layer formed of a first coating layer and a second coating layer, wherein the process comprises the steps of:
   a) coating a substrate with a first coating composition comprising one or more radiation-sensitive ingredients to form the first coating layer, which is polymerizable and/or crosslinkable, on the substrate, b) locally treating the first coating layer on the substrate with electromagnetic radiation having a periodic or random radiation-intensity pattern, to thereby form a latent image in the first coating layer, c) applying, without an intervening step, a second coating composition to form the second coating layer on top of the latent image of the first coating layer and thereby provide the bi-layer on the substrate, wherein the second coating composition consists of a dissolved polymer ($C_p$), and wherein one of the first and second coating compositions is hydrophilic and another of the first and second coating compositions is hydrophobic sufficient to cause the first coating layer and the second coating layer to be mutually insoluble and/or substantially non-interactive with one another at an interface therebetween, and wherein the dissolved polymer in the second coating layer has a weight averaged molecular weight of at least 5 kDalton; and d) polymerizing and/or crosslinking the resulting coated bi-layer on the substrate by a heating step to thereby develop the latent image of the first coating layer.

2. A photoembossing process according to claim 1, wherein the dissolved polymer ($C_p$) reduces interfacial tension of the second coating layer an the interface with the first coating layer.

3. A photoembossing process according to claim 1, wherein the one or more radiation-sensitive ingredients in step a) comprise one or more monomers, optionally a solvent, and wherein the first coating composition comprises a polymerization initiator.

4. A photoembossing process according to claim 3, wherein the polymerization initiator is a mixture of a photo-initiator and a thermal initiator.

5. A photoembossing process according to claim 3, wherein the polymerization initiator is a thermal initiator or a mixture of a photo-initiator and a thermal initiator.

6. A photoembossing process according to claim 1, wherein the first coating composition applied according to step a) also comprises a polymer.

7. A photoembossing process according to claim 6, wherein the polymer in the first coating layer applied to the substrate in step a) has a weight-averaged molecular weight (Mw) of at least 20,000 g/mol.

8. A photoembossing process according to claim 6, wherein the polymer in the first coating layer applied to the substrate in step a) has a glass transition temperature of at least 300 K.

9. A photoembossing process according to claim 6, wherein the polymer is dissolved in one or more monomers present in the first coating composition applied to the substrate according to step a).

10. A photoembossing process according to claim 1, comprising evaporating solvent from the first coating layer to form a solid film thereof.

11. A photoembossing process according to claim 1, wherein step b) includes placing a photo-mask in direct contact with the first coating layer.

12. A photoembossing process according to claim 1, wherein step b) is practiced by using UV-light as the electromagnetic radiation in combination with a mask.

13. A photoembossing process according to claim 1, wherein step b) is practiced by using light interference/holography.

14. A photoembossing process according to claim 1, wherein step b) is practiced using electron beam lithography.

15. A photoembossing process according to claim 1, wherein the substrate is a polymeric substrate.

16. A photoembossing process according to claim 1, wherein the one or more radiation-sensitive ingredients of the first coating composition are selected from the group consisting of (meth-) acrylates, epoxies, oxetanes, vinyl ethers, styrenes, and thiol-enes.

17. A photoembossing process according to claim 1, wherein $C_p$ is present in an amount of from 0.05-5 times an amount of the first coating composition.

18. A photoembossing process according to claim 1, wherein $C_p$ comprises at least one polymer selected from the group consisting of thermoplastic semi-crystalline polymers, amorphous polymers, thermoplastic elastomers, and chemically crosslinkable rubbers.

19. A photoembossing process according to claim 1, wherein $C_p$ further comprises an organic filler.

20. A photoembossing process according to claim 1, wherein step b) is performed at a temperature between 175 and 375 K.

21. A photoembossing process according to claim 1, wherein step c) is performed at a temperature of between 300 and 575 K.

* * * * *